United States Patent
Li et al.

(10) Patent No.: US 10,948,532 B1
(45) Date of Patent: Mar. 16, 2021

(54) INSULATION DIAGNOSIS AND POSITIONING METHOD FOR INSULATED BUS PIPE

(71) Applicants: STATE GRID HUBEI ELECTRIC POWER RESEARCH INSTITUTE, Hubei (CN); STATE GRID CORPORATION OF CHINA, Beijing (CN)

(72) Inventors: Wenpei Li, Hubei (CN); Ling Ruan, Hubei (CN); Rui Liu, Hubei (CN)

(73) Assignees: STATE GRID HUBEI ELECTRIC POWER RESEARCH INSTITUTE; STATE GRID CORPORATION OF CHINA

(*) Notice: Subject to any disclaimer, the term of this patent is extended or adjusted under 35 U.S.C. 154(b) by 0 days.

(21) Appl. No.: 16/648,114

(22) PCT Filed: Jan. 6, 2020

(86) PCT No.: PCT/CN2020/070476
§ 371 (c)(1),
(2) Date: Mar. 17, 2020

(30) Foreign Application Priority Data

Jul. 22, 2019 (CN) .......... 201910662147.X

(51) Int. Cl.
G01R 31/08 (2020.01)
(52) U.S. Cl.
CPC ......... *G01R 31/088* (2013.01); *G01R 31/081* (2013.01)
(58) Field of Classification Search
CPC .. G01R 31/088; G01R 31/081; G01R 31/025; G01R 31/14; G01R 31/006;
(Continued)

(56) References Cited

U.S. PATENT DOCUMENTS

2007/0117445 A1* 5/2007 Yamaura .......... H03K 17/962
439/404
2014/0021965 A1* 1/2014 De Rybel .......... G01R 15/06
324/632
(Continued)

OTHER PUBLICATIONS

Translation of allowed claims of Chinese Application No. 201910662147.X.
(Continued)

*Primary Examiner* — Thang X Le
(74) *Attorney, Agent, or Firm* — Burns & Levinson, LLP; Joeseph M. Maraia

(57) ABSTRACT

Provided are an insulation diagnosis and defect positioning method, apparatus and device for an insulated bus pipe, and a storage medium. The method includes: applying a test voltage between a ground electrode and a conductor portion of the insulated bus pipe; identifying multiple grounded segments of the insulated bus pipe according to a ground shielded short wiring and a line ground wiring, measuring a length of each grounded segment and a ground current of each grounded segment at the test voltage, and calculating a ground current per unit length of each grounded segment; comparing ground currents per unit length of different grounded segments; measuring a capacitance current value of each grounded segment according to a quantity, a length and a number of intermediate couplings included in each grounded segment; comparing the ground current and the capacitance current value of each grounded segment; according to the comparison results, diagnosing an insulation status and implementing defect positioning of the insulated bus pipe.

7 Claims, 3 Drawing Sheets

(58) Field of Classification Search
CPC ............ G01R 31/1218; G01R 31/1254; G01R 31/1272; G01R 31/58; G01R 31/59; G01R 31/16; G01R 31/129
See application file for complete search history.

(56) References Cited

U.S. PATENT DOCUMENTS

2015/0168480 A1* 6/2015 Robin ................ G01R 31/1272
324/551
2015/0293167 A1* 10/2015 Kawamura ........... B60L 3/0069
324/551

OTHER PUBLICATIONS

Translation of Notification to Grant Patent Right for Invention for Chinese Application No. 201910662147.X.
Translation of first Office Action for Chinese Application No. 201910662147.X.

* cited by examiner

INSULATION DIAGNOSIS AND POSITIONING METHOD FOR INSULATED BUS PIPE

This is a U.S. National Stage Application, filed under 35 U.S.C. 371, of International Patent Application No. PCT/CN2020/070476, filed on Jan. 6, 2020, which claims priority to Chinese patent application No. 201910662147.X filed on Jul. 22, 2019, contents of both of which are incorporated herein by reference in their entireties.

TECHNICAL FIELD

The present application relates to a technical field of power transmission and distribution, in particular, to an insulation diagnosis and positioning method for an insulated bus pipe.

BACKGROUND

The insulated bus pipe is a current-carrying equipment with copper or aluminum metal round tube as a conductor, and has an insulating casing and an outer grounding shield layer. The common voltage level is 6 kV-35 kV, and is mostly used as current-carrying equipment to connect a low-voltage side of the transformer and the switch cabinet. The unique structural characteristic enables the insulated bus pipe to have outstanding advantages of large current-carrying capacity, good mechanical properties, safety, space-saving, small maintenance and good weather resistance. With the development trend of large-capacity, compaction, high safety and high environmental compatibility requirement for power transmission, the insulated bus pipe has been widely used for being suitable for the above development requirements.

However, unlike semi-insulated buses and closed buses that are previously used in the large-current catchment part, operational reliability of the insulated bus pipe equipment is determined by a solid insulation status of the insulated bus pipe equipment. During the operation, maintenance, and repairing of this type of equipment, an examination and status diagnosis method highly targeted to the common insulation problem of this type of equipment is lacked, so that the equipment is in a uncontrolled state, many defects/hidden dangers could not be detected early, which eventually lead to equipment insulation damage, short-circuit failure, power failure, and serious damage to the equipment such as connected transformers, switch cabinets, causing major losses. Therefore, it is necessary to develop a method for diagnosing the insulation status of this type of equipment.

SUMMARY

The present application provides a rapid insulation diagnosis and defect positioning method which requires less devices, has a high performance on common defects and hidden dangers and is easy to be implemented and executed at maintenance sites. The present application solves the problem of rapid insulation state diagnosis and defect positioning of the equipment by utilizing a structural characteristic of multi-segment connection and segmented grounding of the insulated bus pipe.

The present application provides an insulation diagnosis and defect positioning method for an insulated bus pipe. The method includes the following steps.

A first end of an insulated bus pipe is disconnected from other devices and a second end of the insulated bus pipe is disconnected from other devices. Connection between a ground electrode and a line ground wiring of the insulated bus pipe is maintained, and a test voltage is applied between the ground electrode and a conductor portion of the insulated bus pipe.

The test voltage and a test frequency are recorded when ground currents of grounded segments are measured.

The multiple grounded segments are identified according to a ground shielded short wiring, and a quantity, a length and a number of intermediate couplings included in each grounded segment are recorded.

A length of each grounded segment and a ground current of each grounded segment are measured at the test voltage, and a ground current per unit length of each grounded segment is calculated.

In a case where a consistent test voltage and test frequency are applied to different grounded segments and the different grounded segments have a same structure, ground currents per unit length of the different grounded segments are compared.

Manufacturer experience data is checked, and the manufacturer experience data includes a capacitance $c_b$ per unit length of an insulated bus pipe body, a capacitance $c_j$ per unit length of the intermediate couplings or ex-factory test data of the capacitance of each intermediate coupling: capacitances of the intermediate couplings numbered k, k+1, . . . , k+n comprised in each grounded segment are respectively $C_{jk}$, $C_{jk+1}$, . . . $C_{jk+n}$. The capacitance current value of each grounded segment is calculated by the following formula: $I_C = U_t \cdot (2\pi f \Sigma C)$, where $\Sigma C = c_b \cdot l_b + c_j \cdot l_j$ or $\Sigma C = c_b \cdot l_b + C_{jk} + C_{jk+1} + \ldots + C_{jk+n}$, where $U_t$ is the test voltage, f is the test frequency, $l_b$ is a total length of the insulated bus pipe body comprised in each grounded segment, $l_j$ a total length of the intermediate couplings included in each grounded segment, k is a positive integer and n is a non-negative integer. The ground current of each grounded segment is compared with the capacitance current value of each grounded segment.

The insulation status is diagnosed and defect positioning of the insulated bus pipe is carried out according to a comparison result of the ground currents per unit length of different grounded segments and a comparison result between the ground current of each grounded segment and the capacitance current value of each grounded segment.

In an embodiment, an amplitude of the test voltage and the test frequency are selected according to the following requirements: a voltage amplitude $U_t$ is not lower than 5 kV and is not higher than a withstand voltage test level in an insulated bus pipe status maintenance test; the frequency ranges from 30 Hz to 300 Hz; a waveform is a sine wave which is approximately symmetric with respect to positive and negative axes.

In an embodiment, applying the test voltage $U_t$ between the ground electrode and a conductor portion of the insulated bus pipe includes: applying a voltage with a fixed frequency within the frequency range between the insulated bus pipe and the ground electrode, and boosting the voltage to the test voltage.

In an embodiment, identifying the grounded segments according to the ground shielded short wiring includes: for the insulated bus pipe whose intermediate coupling is in a shield tube structure, determining a shield tube and the insulated bus pipe body connected by the ground shielded short wiring as one grounded segment; and in a case where no ground shielded short wiring connects the insulated bus pipe body and the shield tube, segmenting the insulated bus pipe body and the shield tube at an intermediate connection position.

In an embodiment, diagnosing the insulation status and implementing defect positioning of the insulated bus pipe according to the comparison result of the ground currents per unit length of different grounded segments and the comparison result between the ground current of each grounded segment and the capacitance current value of each grounded segment includes the following steps.

In a case where for each grounded segment, a difference between the ground current per unit length of the grounded segment and the ground current per unit length of each other grounded segment is less than or equal to 10% of the ground current per unit length of the grounded segment, it is determined that a ground current indicator of the insulated bus pipe is normal. In a case where the difference between the ground current per unit length of one grounded segment and the ground current per unit length of each other grounded segment is greater than 10% of the ground current per unit length of the one grounded segment, it is determined that the one grounded segment is a defect segment or a fault segment.

In a case where for each grounded segment, a difference between the ground current and the capacitance current value is less than or equal to 3% of the capacitance current value, it is determined that a current indicator of the insulated bus pipe is normal. In a case where a difference between the ground current of one grounded segment and the capacitance current value of the one grounded segment is greater than 3%, it is determined that the one grounded segment is the defect segment or the fault segment.

In a case where a ground current value of the defect segment or the fault segment is greater than a preset value, it is determined that the insulated bus pipe insulation has insulation deterioration, or creeping discharging occurs in an interior or an end part of the intermediate coupling of the defect segment or the fault segment.

The embodiment of the present disclosure further provides an electronic device. The electronic device includes a processor and a memory. The memory is configured to store computer programs which, when executed by the processor, implement the method provided by any embodiment described above.

An embodiment of the present application provides a computer-readable storage medium. The computer-readable storage medium is configured to store computer programs which, when executed by a processor, implement the method provided by any embodiment described above.

DETAILED DESCRIPTION

Technical solutions of the present disclosure will be described below with reference to the drawings.

The insulated bus pipe equipment includes multiple segments which are integrated into a whole, and is grounding in segments, such grounding manner is complex, but provides convenience for insulation status detection and fault positioning of this type of equipment. Therefore, the present disclosure provides an insulation diagnosis and defect positioning method based on the ground current measurement.

Figure 1:
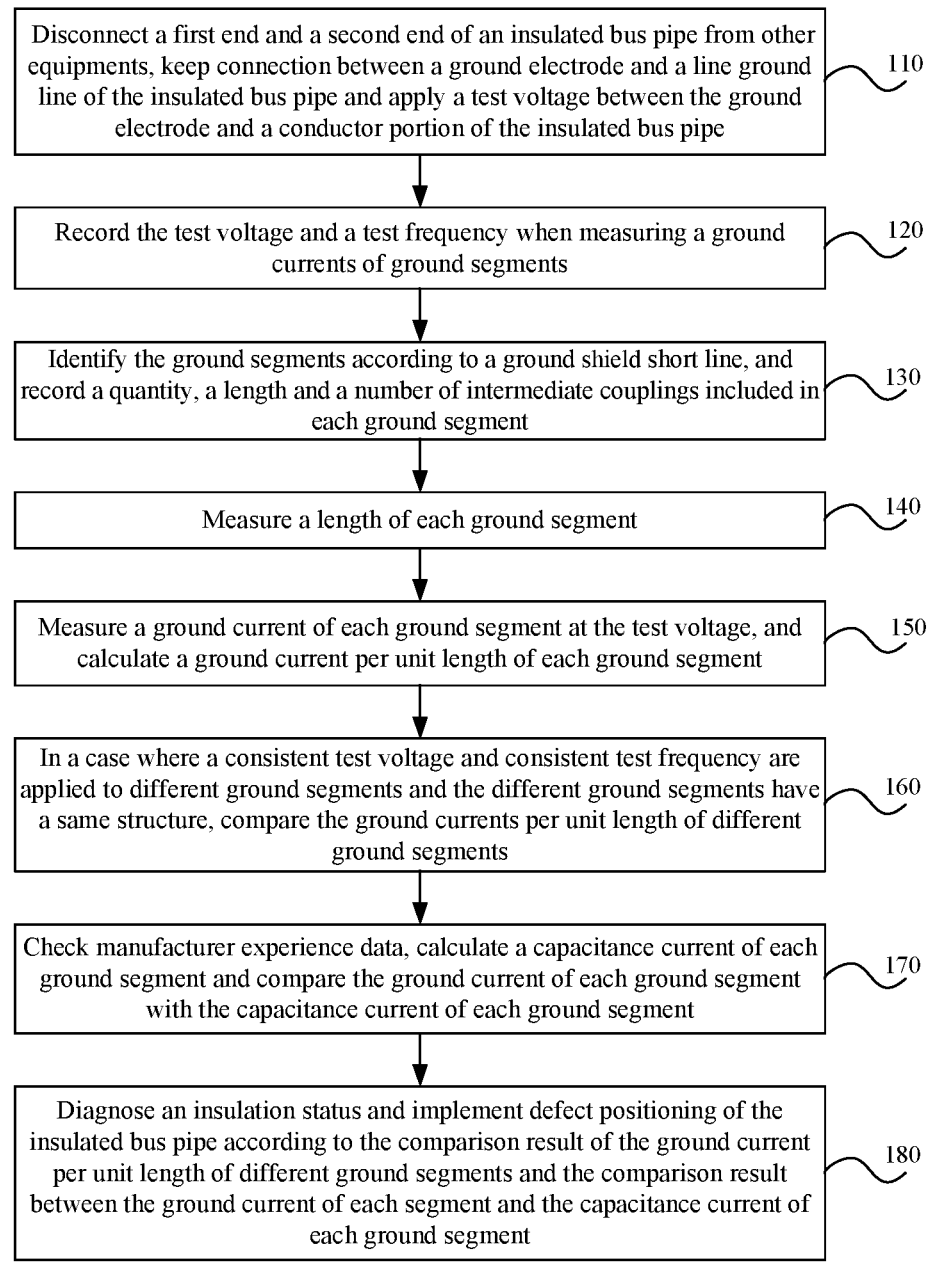
FIG. 1 is a flowchart of an insulation diagnosis and defect positioning method for an insulated bus pipe provided by an embodiment of the present disclosure.

FIG. 1 is a flowchart of an insulation diagnosis and defect positioning method for an insulated bus pipe provided by an embodiment of the present disclosure. Referring to FIG. 1, the method provided by the present disclosure includes the steps described below.

In step 110, a first end of an insulated bus pipe is disconnected from other equipment and a second end of the insulated bus pipe is disconnected from other equipment, a connection between a ground electrode and a line ground wiring of the insulated bus pipe is kept, and a test voltage is applied between the ground electrode and a conductor portion of the insulated bus pipe.

In step 120: the test voltage and a test frequency is recorded during the measurement of ground currents of grounded segments.

In step 130, the multiple grounded segments are identified according to a ground shielded short wiring, and a quantity, a length and a number of intermediate couplings included in each grounded segment are recorded.

In step 140, a length of each grounded segment is measured.

In step 150, a ground current of each grounded segment is measured at the test voltage, and a ground current per unit length of each grounded segment is calculated.

In step 160, in a case where a consistent test voltage and test frequency are applied to different grounded segments and the different grounded segments have a same structure, the ground currents per unit length of different grounded segments are compared.

In step 170, manufacturer experience data is checked, the manufacturer experience data includes a capacitance $c_b$ per unit length of an insulated bus pipe body, a capacitance $c_j$ per unit length of the intermediate coupling or ex-factory test data of the capacitance of each intermediate coupling: capacitances of the intermediate couplings numbered k, k+1, ..., k+n included in each insulated bus pipe grounded section are respectively $C_{jk}$, $C_{jk+1}$, ... $C_{jk+n}$; a A capacitance current value of each insulated bus pipe grounded section is calculated by the following formula: $I_C = U_t \cdot (2\pi f \cdot \Sigma C)$, where $\Sigma C = c_b \cdot l_b + c_j \cdot l_j$ or $\Sigma C = c_b \cdot l_b + C_{jk} + C_{jk+1} + \ldots + C_{jk+n}$, where $U_t$ is the test voltage, f is the test frequency, $l_b$ is a total length of the insulated bus pipe bodies of the ground sections, a total length of the intermediate couplings included in the insulated bus pipe grounded sections, k is a positive integer and n is a non-negative integer. The ground current of each insulated bus pipe grounded section is compared with the capacitance current value of each insulated bus pipe grounded section.

In step 180, an insulation status is diagnosed and defect positioning of the insulated bus pipe is implemented according to a comparison result of the ground currents per unit length of different grounded segments and a comparison result between the ground current of each grounded segment and the capacitance current value of each grounded segment.

Figure 2:
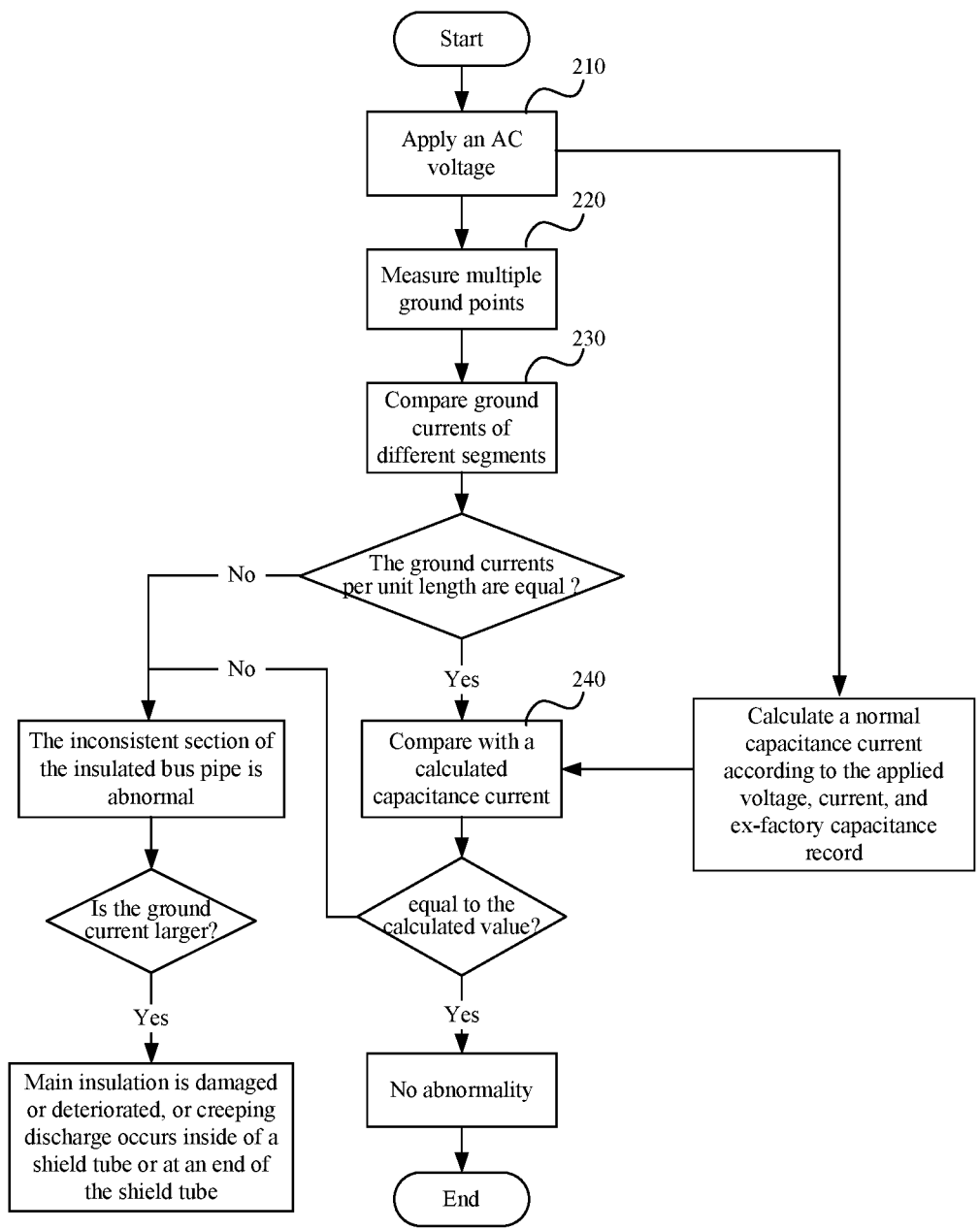
FIG. 2 is a flowchart of another insulation diagnosis and defect positioning method for an insulated bus pipe provided by an embodiment of the present disclosure.

Insulation diagnosis and defect positioning for the insulated bus pipe are illustrated according to the flowchart described in FIG. 2, the method provided by the embodiment of the present disclosure includes the steps described below.

Figure 3:
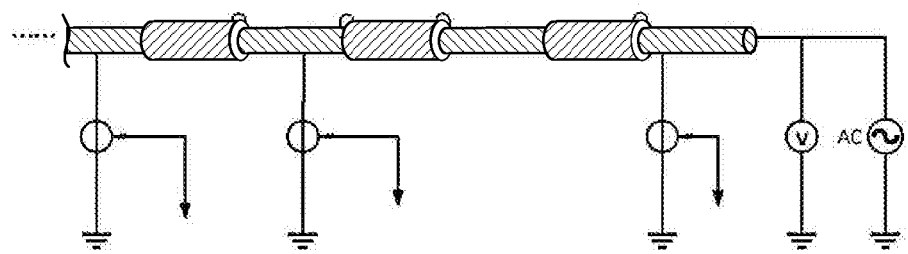
FIG. 3 is a schematic diagram of a testing circuitry for boosting multiple segments of an insulated bus pipe and performing ground current measurement provided by an embodiment of the present disclosure.

In step 210, wirings are connected according to the connection manner shown in FIG. 3, and a voltage is applied.

After disconnecting the two ends of the insulated bus pipe from other equipment (such as a transformer, a switch cabinet, etc.), the wirings are connected according to the connection manner shown in FIG. 3. An AC test voltage is applied between a conductor portion of the insulated bus pipe and the ground electrode. If a multi-phrase insulated bus pipe is used, multiple phrases are applied at the same time. The voltage is applied in a frequency series resonance method, or a parallel compensation method or is directly applied. In an embodiment, an amplitude and frequency of the applied voltage are selected according to the following requirements: a voltage amplitude $U_t$ is not lower than 5 kV and is not higher than a withstand voltage test level in an equipment status maintenance test; the frequency ranges from 30 Hz to 300 Hz; a waveform of the test voltage is a sine wave which is approximately symmetrical with respect to positive and negative axes.

After wiring connection is completed, the test voltage is adjusted to an appropriate voltage frequency and is gradually boosted to $U_t$. After the voltage is stable, the measurement may be performed and the voltage is kept until the measurement ends.

In step 220, a ground current and test related parameters of each grounded segment are measured.

(1) The test voltage $U_t$ and a frequency f at the time of measuring a ground current of each of the grounded segments are recorded.

Figure 4:
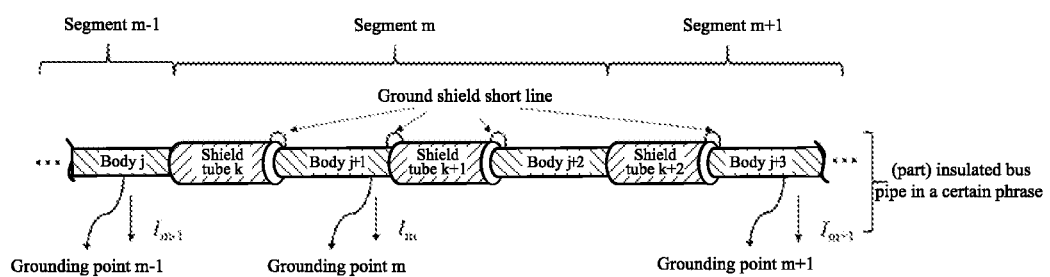
FIG. 4 is a schematic diagram of a method for identifying a structure and segmenting manner of multiple segments of an insulated bus pipe provided by an embodiment of the present disclosure.

(2) The grounded segments are identified according to the ground shielded short wiring shown in FIG. 4. For the insulated bus pipe whose intermediate coupling is in a shield tube structure, the shield tube and the body connected by the ground shielded short wiring serve as one grounded segment. If no ground shielded short wiring apparently connects the body and the shield tube, the wiring is segmented at an intermediate connection.

(3) The quantity, length and number of intermediate couplings included in each grounded segment are recorded.

(4) A length l of each grounded segment is measured.

(5) A ground current I of each grounded segment at the test voltage is measured.

Data ($U_t$, f, l, I) measured in this step is the analyzing basis for the insulation diagnosis and defect positioning of the insulated bus pipe.

In step 230, the ground current values per unit length of different grounded segments are compared.

When different grounded segments have a consistent applied voltage (an amplitude $U_t$ and a frequency f) and a same structure (same quantity of intermediate couplings and same intermediate coupling type), the ground currents (I/l) per unit length of different grounded segments are compared. The ground currents per unit length of different grounded segments are basically equal. When the ground currents have a large difference, the insulation status of the insulated bus pipe is abnormal, and a determination method is shown in step 250.

In an embodiment, the same structure includes that the grounded segment has the same quantity of intermediate couplings and the same quantity of insulated bus pipe bodies. In step 240, a measured value of the ground current of the grounded segment is compared with a capacitance current calculation value of this grounded segment.

According to the test voltage $U_t$, the test frequency f, the length $l_b$ of the insulated bus pipe body included in a certain grounded segment, and numbers k, k+1 . . . or length $l_j$ of the intermediate coupling, manufacturer experience data is checked. The manufacturer experience data includes a capacitance $c_b$ per unit length of the body, a capacitance $c_j$ per unit length of the intermediate coupling, or ex-factory test data of the capacitance of each intermediate coupling: the capacitances of the intermediate couplings numbered k, k+1 . . . are respectively $C_{jk}$, $C_{jk+1}$, . . . . The capacitance current value of the grounded segment is calculated: $I_C = U_t \cdot (2\pi f \cdot \Sigma C)$, where $\Sigma C = c_b \cdot l_b + c_j \cdot l_j$ or $\Sigma C = c_b \cdot l_b + C_{jk} + C_{jk+1} + \ldots$.

After calculating the capacitance current value of each grounded segment, the measured value of the ground current is compared with the capacitance current value of each grounded segment. The measured value of the ground current and the capacitance current value are basically equal for each grounded segment. When the measured value of the ground current and the capacitance current value have a large difference, the insulation status of the insulated bus pipe is abnormal, and a determination method is shown in the step 250.

In step 250, according to the comparison results of the steps 230 and 240, the insulation status is diagnosed and defects of the insulated bus pipe are positioned.

(1) Insulation Diagnosis and Defect Positioning Based on Ground Current Comparison Results The ground current values per unit length of different grounded segments are compared. If the ground current values per unit length of the different grounded segments are approximately equal (for example, for each grounded segment, a difference between the ground current per unit length of this grounded segment and the ground current per unit length of each other grounded segment is less than or equal to 10% of the ground current per unit length of this grounded segment), it is considered that the ground current indicator of the of the insulated bus pipe is normal. If the difference between the ground current value per unit length of a certain grounded segment and the ground current value per unit length of other grounded segment is large (for example, the difference between the ground current value per unit length of a certain grounded segment and the ground current value per unit length of other grounded segment is greater than 10% of the ground current per unit length of this grounded segment), it is considered that the grounded segment is a defect segment or fault segment.

For the insulated bus pipe with complete manufacturer information, when the insulation status of the equipment needs to be determined more accurately, the measured value of the ground current of the grounded segment may be compared with the capacitance current calculation value of this grounded segment. If the difference between the measured value of the ground current and the capacitance current calculation value of each grounded segment is very small (for example, the difference between the ground current and the capacitance current value is less than or equal to 3% of the capacitance current value, it is considered that the ground current indicator of the insulated bus pipe is normal. If the difference between the measured value of the ground current and the capacitance current calculation value of this grounded segment is relatively larger (for example, the difference between the ground current and the capacitance current value is greater than 3% of the capacitance current value), the grounded segment is the defect segment or the fault segment.

(2) Preliminary Analysis of Insulation Reasons Based on Ground Current Comparison Results In the above comparison, if the measured value of the ground current in the defect segment or the fault segment is too large, such as greater than a preset value, the equipment has insulation deterioration, or creeping discharging occurs inside or at an end of the intermediate coupling.

In step 260, the insulation diagnosis and defect positioning end, and test wirings are removed.

In a simulation test carried out to verify rationality and effectiveness of this method, simulation of applying a voltage to 3 segments of insulated bus pipe specified by 10 kV/2500 A produced by a certain factory is carried out. The length of each segment is 2.1 m, and the first segment is a sample in good insulation status, the second segment is a sample for simulating a capacitance shielding caused by internal defects, and the third segment is a sample for simulating dirty insulation (relatively severe) and being watered at the external end. An AC voltage with an amplitude of 10 kV and a frequency of 50 Hz is applied according to the manner shown in FIG. 3. Ground currents of three grounded segments are measured to be 5.54 mA, 7.21 mA and 8.58 mA. The following may be obtained by analysis.

(1) Ground current values per unit length of three grounded segments are 2.64 mA/m, 3.43 mA/m and 4.10 mA/m, the ground current value per unit length of the second grounded segment is larger than that of the first segment by 30%, and the ground current value per unit length of the third grounded segment is larger than that of the first segment by 55%. It is shown that the comparison determination method of the step 230 is effective.

(2) The three grounded segments have the same capacitance current calculation value (the structure and material are same), which is 5.50 mA. The ground current value of the first insulated bus pipe segment is larger than the capacitance current calculation value of the first insulated bus pipe segment by 1%. The ground current value of the second insulated bus pipe segment is larger than the capacitance current calculation value of the second insulated bus pipe segment by 31%. The ground current value of the third insulated bus pipe segment is larger than the capacitance current calculation value of the third insulated bus pipe segment by 56%. It is shown that the comparison determination method of the step 240 is effective.

When insulated bus pipes of the same structure and network operation are in good insulation status, the power is cut off to perform the measurement provided in this application. When a 10 kV voltage is applied, the ground currents per unit length of multiple grounded segments are close to 2.63 mA/m, the delta among the ground currents per unit length of different segments is not great than 10%. It is further shown that the determination manner described in this application is effective.

What is claimed is:

1. An insulation diagnosis and defect positioning method for an insulated bus pipe, comprising:

disconnecting a first end of the insulated bus pipe from other equipment and a second end of the insulated bus pipe from other equipment, keeping connection between a ground electrode and a line ground wiring of the insulated bus pipe and applying a test voltage between the ground electrode and a conductor portion of the insulated bus pipe;

recording the test voltage and a test frequency when measuring a ground current of each of a plurality of grounded segments of the insulated bus pipe;

identifying the plurality of grounded segments according to a ground shielded short wiring, and recording a quantity, a number and a length of intermediate couplings comprised in each grounded segment;

measuring a length of each grounded segment and a ground current of each grounded segment at the test voltage, and calculating a ground current per unit length of each grounded segment;

in a case where a consistent test voltage is applied to different grounded segments with a consistent test frequency and the different grounded segments have a same structure, comparing the ground currents per unit length of different grounded segments;

checking manufacturer experience data, where the manufacturer experience data comprises a capacitance $c_b$ per unit length of an insulated bus pipe body, a capacitance $c_j$ per unit length of the intermediate coupling or ex-factory test data of the capacitance of each intermediate coupling: capacitances of the intermediate couplings numbered k, k+1, . . . , k+n comprised in each grounded segment are respectively $C_{jk}, C_{jk+1}, \ldots C_{jk+n}$, calculating a capacitance current value of each grounded segment by the following formula: $I_C=U_t \cdot (2\pi f \cdot \Sigma C)$, where $\Sigma C=c_b \cdot l_b+c_j \cdot l_j$ or $\Sigma C=c_b \cdot l_b+C_{jk}+C_{jk+1}+ \ldots +C_{jk+n}$, wherein $U_t$ is the test voltage, f is the test frequency, $l_b$ is a total length of the insulated bus pipe body comprised in each grounded segment, $l_j$ a total length of the intermediate couplings comprised in the plurality of grounded segments, k is a positive integer and n is a non-negative integer; and comparing the ground current of each grounded segment with the capacitance current value of each grounded segment; and diagnosing an insulation status and implementing defect positioning of the insulated bus pipe according to the comparing result of the ground currents per unit length of different grounded segments and the comparing result between the ground current of each grounded segment and the capacitance current value of each grounded segment.

2. The method of claim 1, wherein an amplitude of the test voltage and the test frequency are selected from: a voltage amplitude $U_t$ is not lower than 5 kV and is not higher than a withstand voltage test level in an insulated bus pipe status maintenance test; the frequency ranges from 30 Hz to 300 Hz; and a waveform of the test voltage is a sine wave which is approximately symmetric with respect to positive and negative axes.

3. The method of claim 2, wherein applying the test voltage between the ground electrode and the insulated bus pipe comprises: applying a voltage with a fixed frequency within the frequency range between the conductor portion of the insulated bus pipe and the ground electrode, and boosting the voltage to the test voltage.

4. The method of claim 1, wherein identifying the grounded segments according to the ground shielding short wiring comprises: for the insulated bus pipe whose intermediate coupling is in a shield tube structure, determining a shield tube and the insulated bus pipe body connected by the ground shielded short wiring as one grounded segment; and in a case where no ground shielded short wiring connects the insulated bus pipe body and the shield tube, segmenting the insulated bus pipe body and the shield tube at an intermediate connection position.

5. The method of claim 1, wherein diagnosing the insulation status and implementing the defect positioning of the insulated bus pipe according to the comparison result of the ground currents per unit length of different grounded segments and the comparison result between the ground current of each grounded segment and the capacitance current value of each grounded segment comprises:

in a case where for each grounded segment, a difference between the ground current per unit length of the grounded segment and the ground current per unit length of each other grounded segment is less than or equal to 10% of the ground current per unit length of the grounded segment, determining that a ground current indicator of the insulated bus pipe is normal; in a case where the difference between the ground current per unit length of one grounded segment and the ground current per unit length of each other grounded segment is greater than 10% of the ground current per unit length of the one grounded segment, determining that the one grounded segment is a defect segment or a fault segment;

in a case where for each grounded segment, a difference between the ground current and the capacitance current value is less than or equal to 3% of the capacitance current value, determining that a current indicator of the insulated bus pipe is normal; in a case where a difference between the ground current of one grounded segment and the capacitance current value of the one grounded segment is greater than 3%, confirming that the one grounded segment is the defect segment or the fault segment; and in a case where a ground current value of the defect segment or the fault segment is greater than a preset value, determining that the insulated bus pipe insulation has insulation deterioration, or creeping discharging occurs in an interior or an end part of the intermediate coupling of the defect segment or the fault segment.

6. An electronic device, comprising a processor and a memory, wherein the memory is configured to store computer programs which, when executed by the processor, implement the method of claim 1.

7. A non-transitory computer-readable storage medium, which is configured to store computer programs which, when executed by the processor, implement the method of claim 1.

* * * * *